US009355818B2

(12) United States Patent
Petric

(10) Patent No.: US 9,355,818 B2
(45) Date of Patent: May 31, 2016

(54) REFLECTION ELECTRON BEAM PROJECTION LITHOGRAPHY USING AN EXB SEPARATOR

(75) Inventor: Paul F. Petric, Pleasanton, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 1180 days.

(21) Appl. No.: 12/790,177

(22) Filed: May 28, 2010

(65) Prior Publication Data

US 2011/0291021 A1    Dec. 1, 2011

(51) Int. Cl.
*H01J 37/147*    (2006.01)
*H01J 37/317*    (2006.01)
*B82Y 10/00*    (2011.01)
*B82Y 40/00*    (2011.01)

(52) U.S. Cl.
CPC ............. *H01J 37/3175* (2013.01); *B82Y 10/00* (2013.01); *B82Y 40/00* (2013.01); *H01J 37/147* (2013.01); *H01J 2237/1508* (2013.01); *H01J 2237/31789* (2013.01)

(58) Field of Classification Search
CPC ........................... H01J 37/3175; H01J 37/147
USPC ....................................................... 250/492.2
See application file for complete search history.

(56) References Cited

U.S. PATENT DOCUMENTS 5,254,417 A     10/1993  Wada
5,319,207 A *   6/1994   Rose et al. ................. 250/396 R
5,422,486 A *   6/1995   Herrmann et al. ......... 250/396 R
6,870,172 B1 *  3/2005   Mankos et al. ........... 250/492.22
7,164,139 B1 *  1/2007   Toth et al. ............... 250/396 ML (Continued)

FOREIGN PATENT DOCUMENTS

JP     2000-182943    6/2000
JP     2004-335193    11/2004

(Continued)

OTHER PUBLICATIONS

Tohru Satake et al., "Electron Beam Inspection System for Semiconductor Wafer Based on Projection Electron Microscopy—II" 2005; pp. 1219-1226; Metrology, Inspection, and Process Control for Microlithography XIX; Proc. of SPIE vol. 5752.

(Continued)

*Primary Examiner* — Robert Kim
*Assistant Examiner* — Eliza Osenbaugh-Stewar
(74) *Attorney, Agent, or Firm* — Okamoto & Benedicto LLP

(57) ABSTRACT

One embodiment disclosed relates to an apparatus for reflection electron beam lithography. The apparatus includes an electron source, a patterned electron reflector generator structure, a stage, a demagnifying electron lens, and an ExB separator. The ExB separator configured to bend a trajectory of the electron beam towards the dynamic pattern generator structure. The patterned electron reflector structure is configured to reflect select portions of the electron beam so as to form a patterned electron beam. The ExB separator is further configured to allow the patterned electron beam to pass straight through towards the demagnifying electron lens. The demagnifying electron lens is configured to demagnify the patterned electron beam and project the demagnified patterned electron beam onto the target substrate. The apparatus disclosed herein has a straight projection axis and substantially reduces the electron beam path by a factor of three-to-one (compared to a prior apparatus which uses a magnetic prism).

12 Claims, 15 Drawing Sheets

(56) References Cited

U.S. PATENT DOCUMENTS

| | | | |
|---|---|---|---|
| 7,358,512 B1 * | 4/2008 | Lordi | 250/492.24 |
| 7,592,612 B2 * | 9/2009 | Tromp | 250/492.22 |
| 7,755,043 B1 * | 7/2010 | Gubbens | 250/307 |
| 7,982,188 B2 * | 7/2011 | Shinada et al. | 250/310 |
| 2003/0183781 A1 | 10/2003 | Tromp | |
| 2008/0169436 A1 * | 7/2008 | Carroll | 250/492.22 |

FOREIGN PATENT DOCUMENTS

| | | |
|---|---|---|
| JP | 2004-342341 | 12/2004 |
| JP | 2006-284592 | 10/2006 |
| JP | 4-137519 | 8/2008 |
| JP | 2009-505398 | 2/2009 |
| TW | 539845 | 7/2003 |
| WO | 2007/019118 | 2/2007 |

OTHER PUBLICATIONS

Yuchiro Yamazaki, et al., "Development of an Electron Optical System using EB Projection Optics in Reflection Mode for EB Inspection" 2003; pp. 212-219; Process and Materials Characterization and Diagnostics in IC Manufacturing; Proceedings of SPIE vol. 5041.

Tohru Satake, et al., "Electron beam inspection system for semiconductor wafer based on projection electron microscopy" 2004; pp. 1125-1134; Metrology, Inspection and Process Control for Microlitography XVIII; Proceedings of SPIE vol. 5375.

Ichirota Nagahama, et al., "Inspection performances of the electron beam inspection system based on projection electron microscopy" 2004; pp. 921-928; Metrology, Inspection and Process Control for Microlitography XVIII; Proceedings of SPIE vol. 5375.

Search Report for ROC (Taiwan) Patent Application No. 100113402, Nov. 4, 2013, 1 sheet.

* cited by examiner

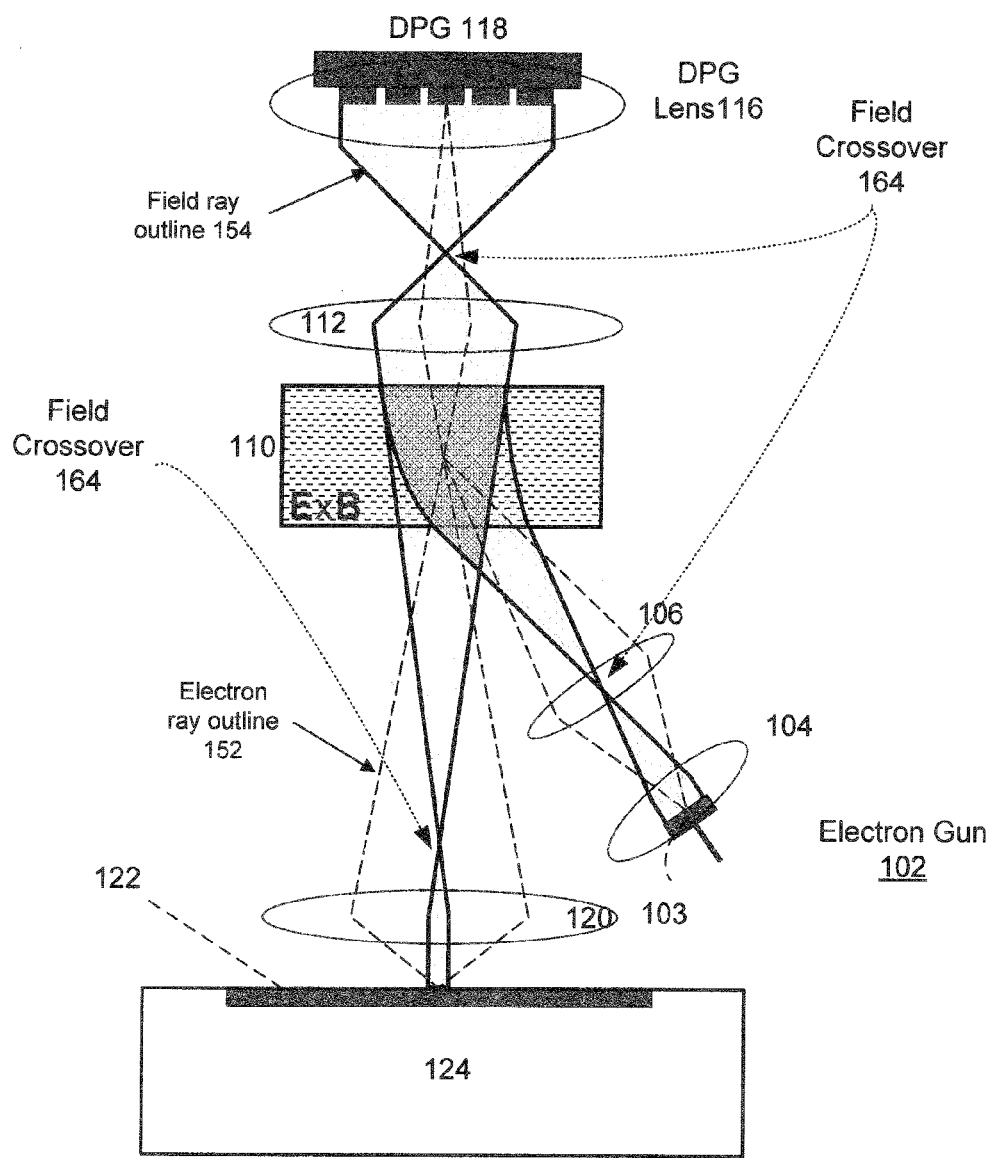
FIG. 1D        100

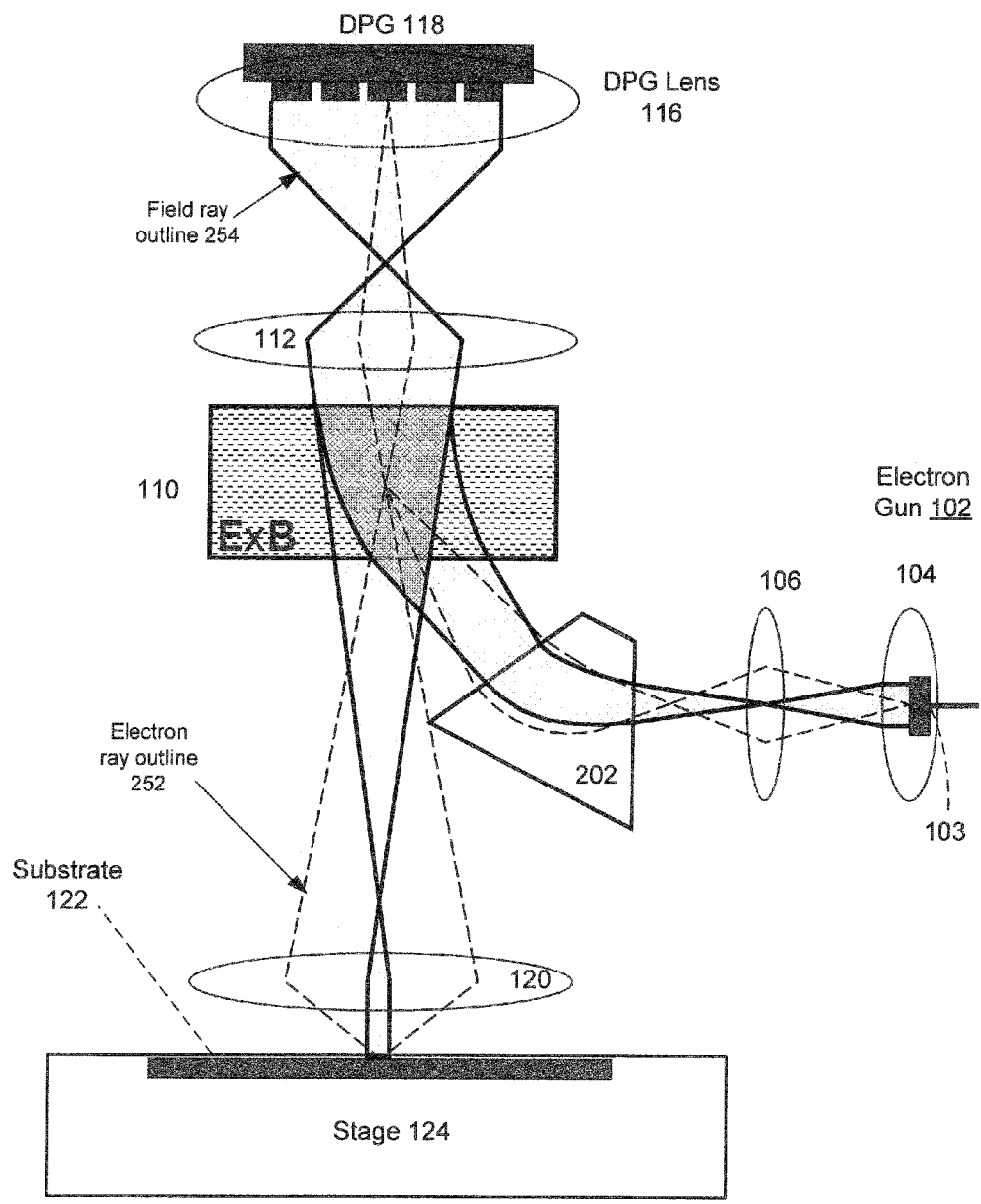
FIG. 2B    200

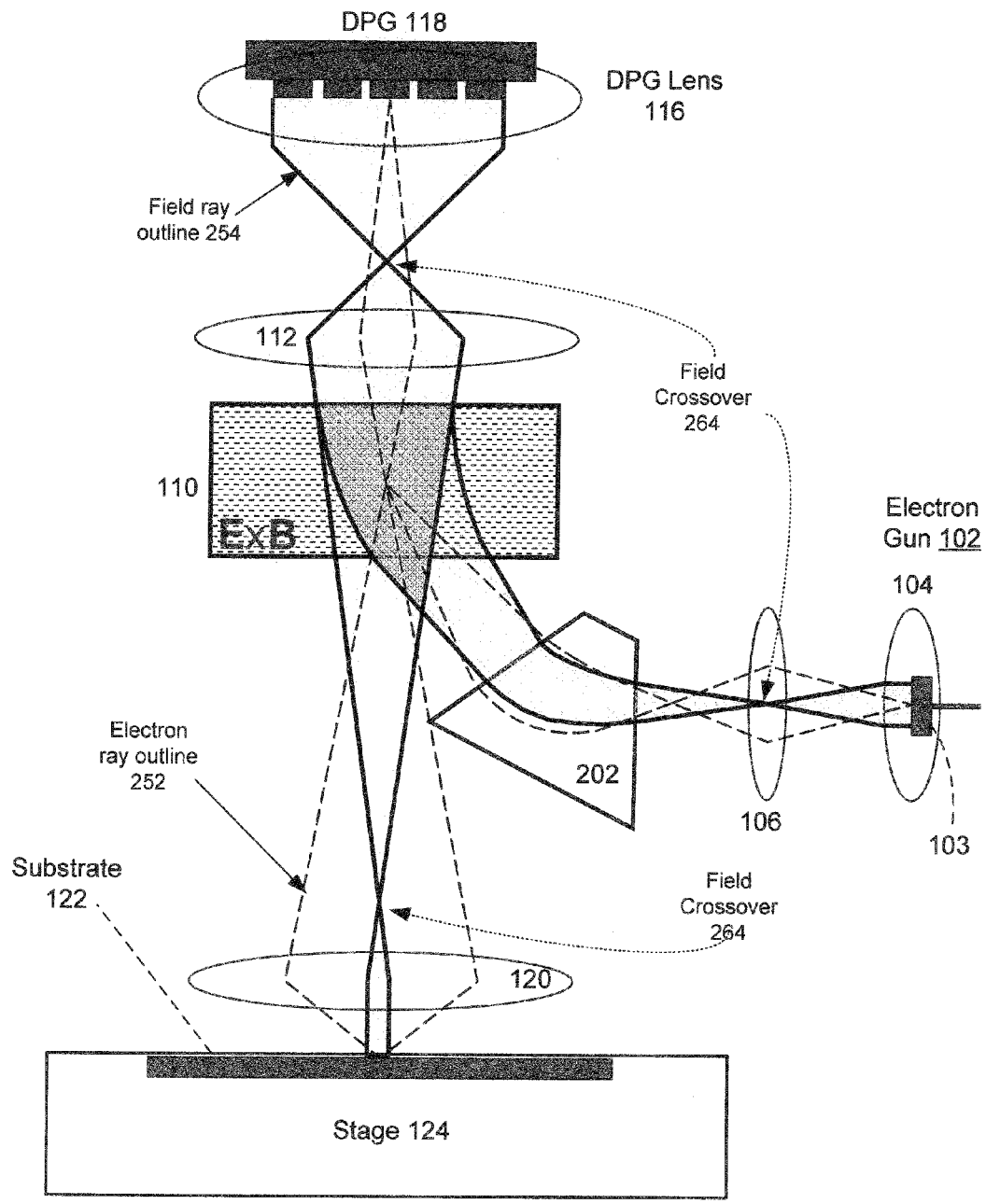
FIG. 2D       200

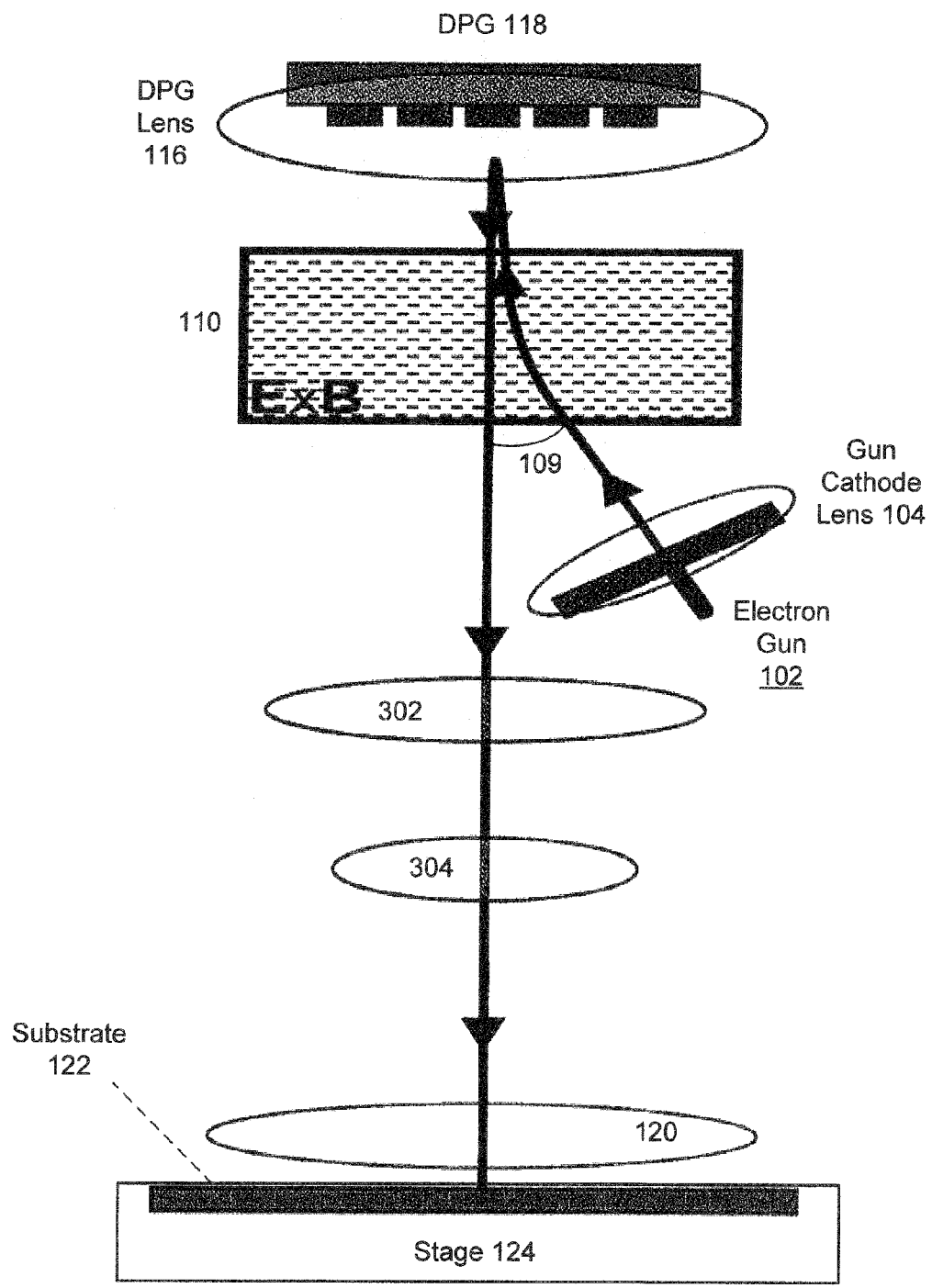
FIG. 3    300

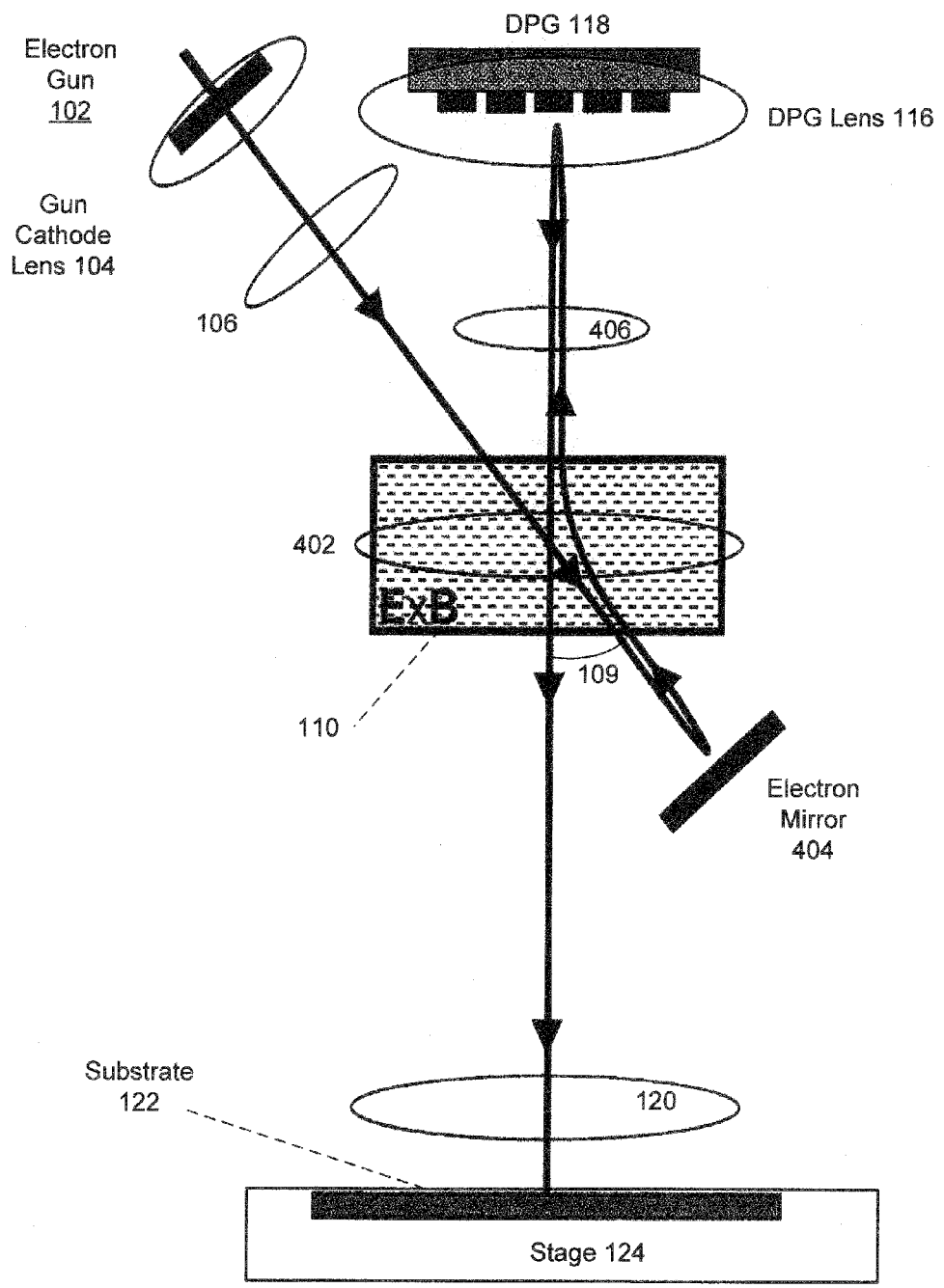
FIG. 4    400

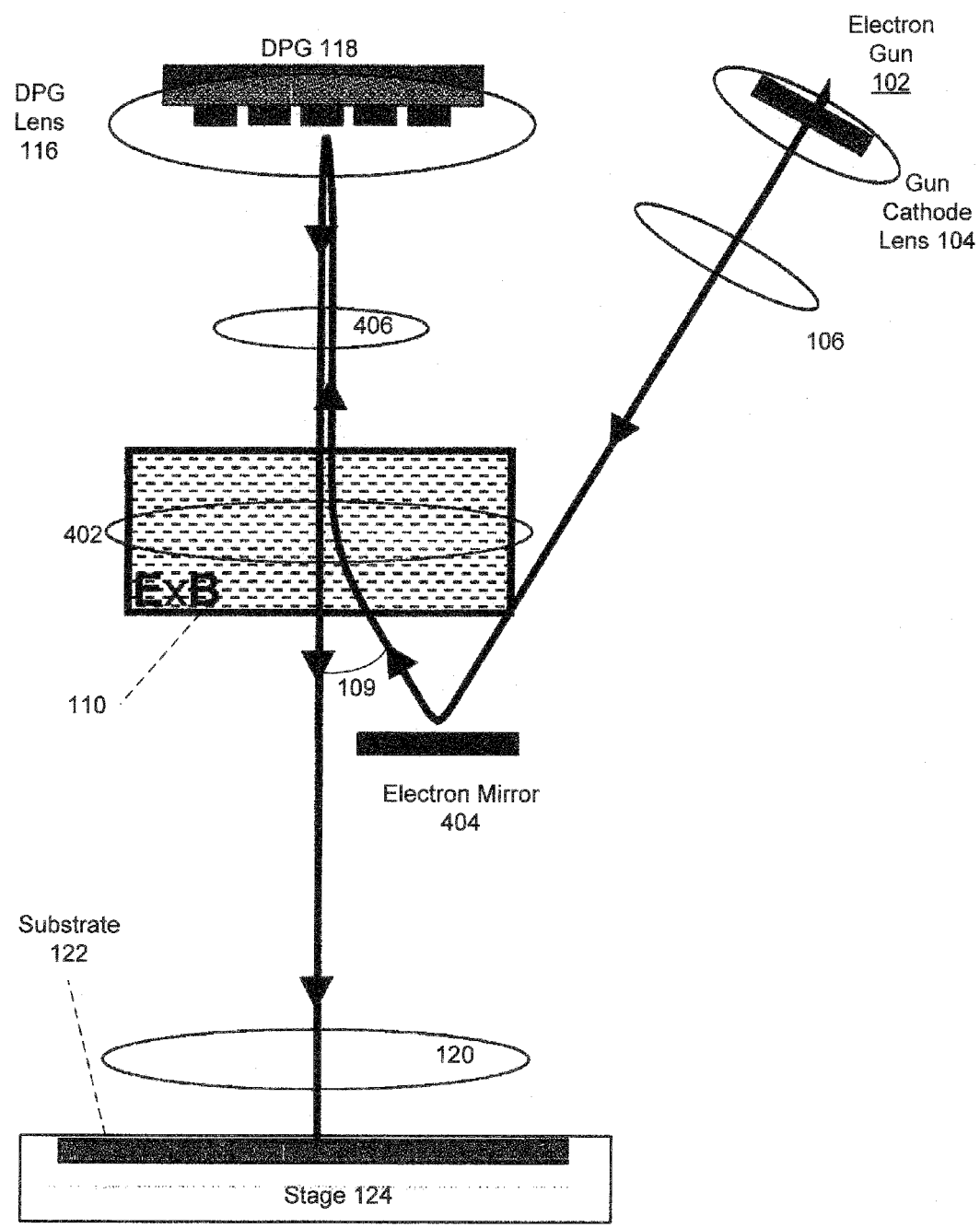
FIG. 5          500

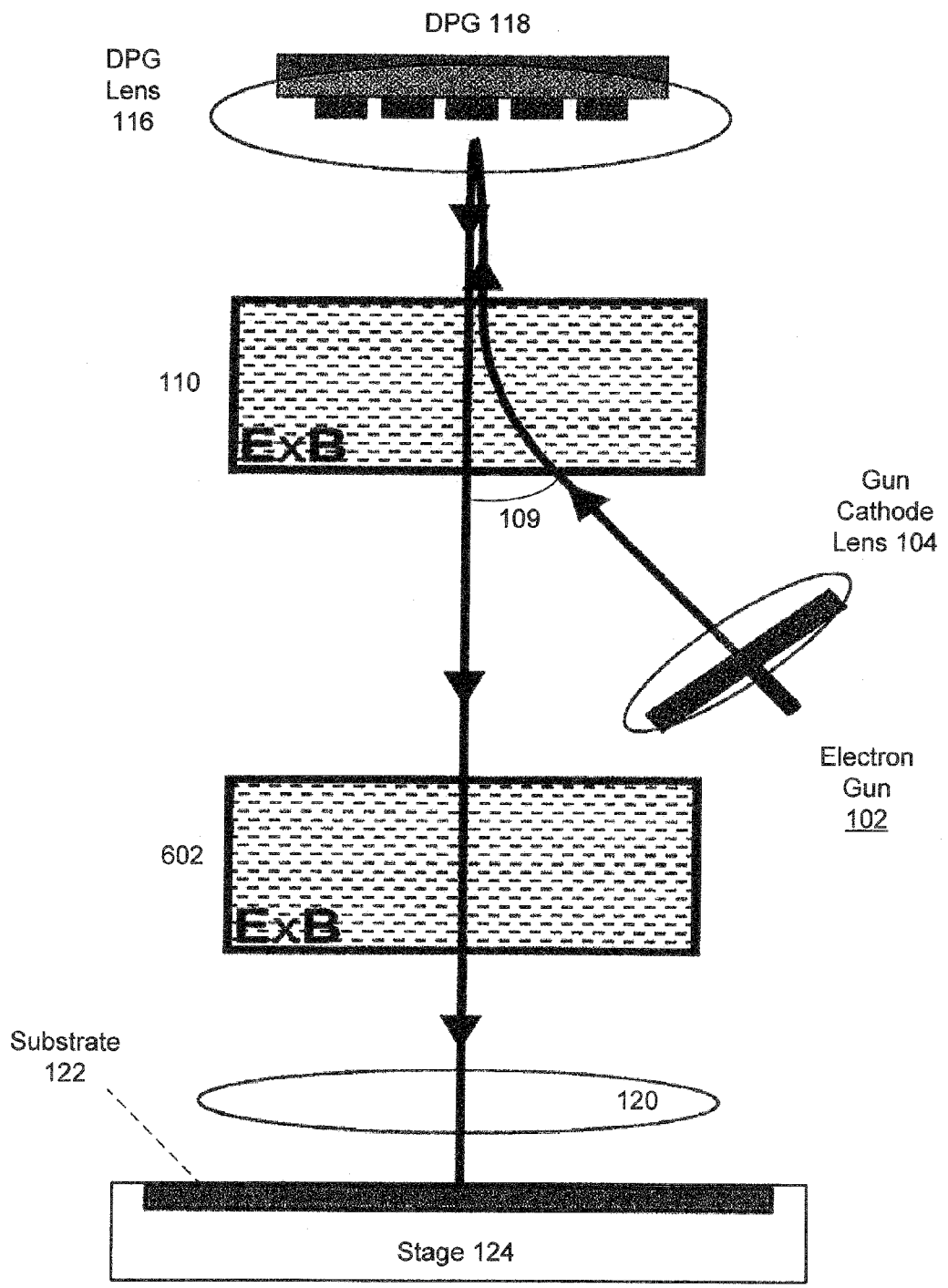
FIG. 6      600

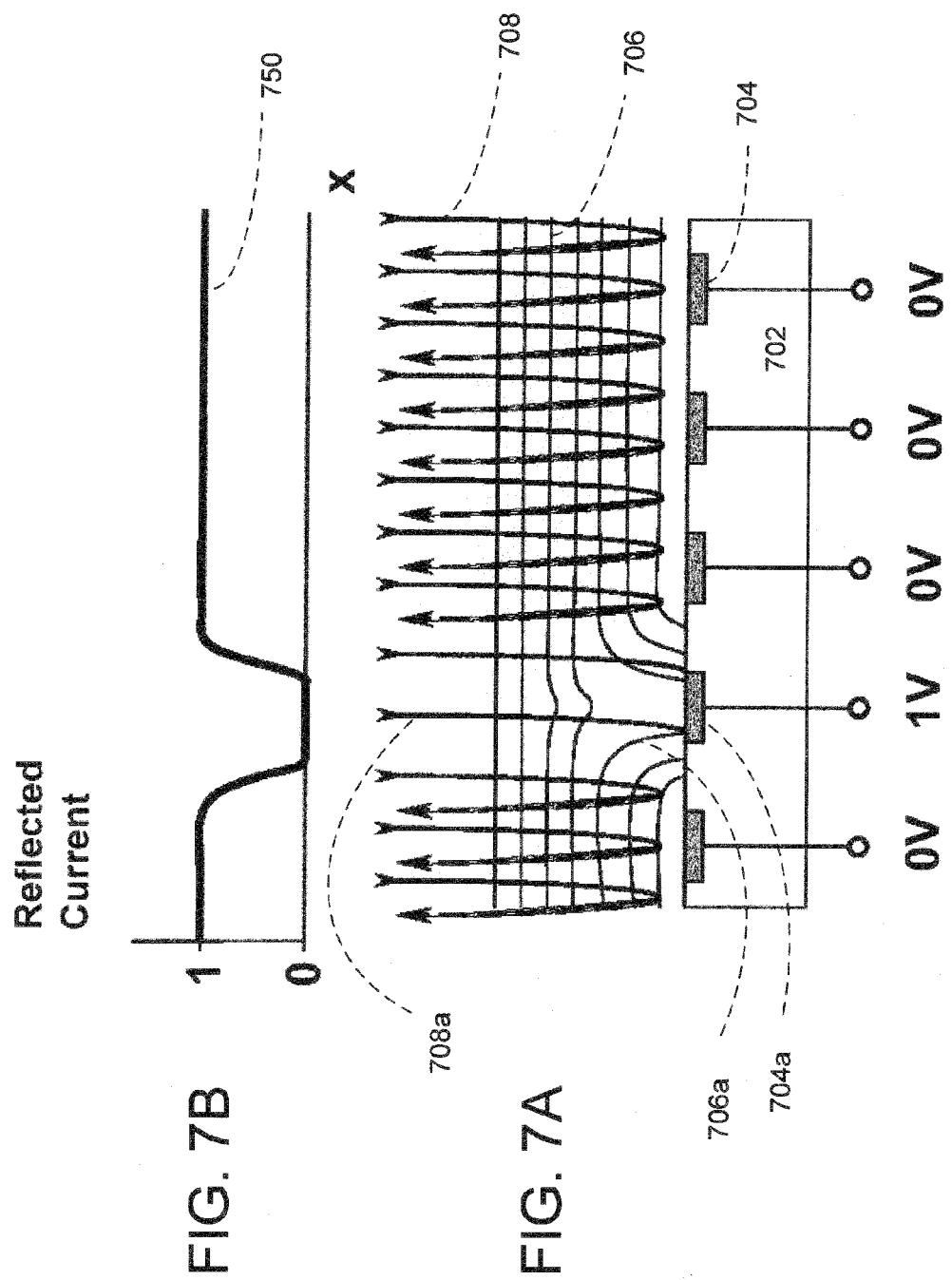

REFLECTION ELECTRON BEAM PROJECTION LITHOGRAPHY USING AN EXB SEPARATOR

STATEMENT REGARDING FEDERALLY SPONSORED RESEARCH OR DEVELOPMENT

The invention described herein was made with government support under contract number HR0011-07-9-0007 awarded by the Defense Advanced Research Projects Agency. The United States Government may have certain rights in the invention.

BACKGROUND OF THE INVENTION

1. Field of the Invention

The present invention relates generally to semiconductor manufacturing and related technologies. More particularly, the present invention relates to electron beam lithography.

2. Description of the Background Art

As is well-understood in the art, a lithographic process includes the patterned exposure of a resist so that portions of the resist can be selectively removed to expose underlying areas for selective processing such as by etching, material deposition, implantation and the like. Traditional lithographic processes utilize electromagnetic energy in the form of ultraviolet light for selective exposure of the resist. As an alternative to electromagnetic energy (including x-rays), charged particle beams have been used for high resolution lithographic resist exposure. In particular, electron beams have been used since the low mass of electrons allows relatively accurate control of an electron beam at relatively low power and relatively high speed. The electron beam system can also generate patterns from digital information directly, making the electron beam lithography, maskless lithography. Electron beam lithographic systems include electron-beam direct-write lithography systems and electron-beam projection lithography systems.

BRIEF DESCRIPTION OF THE DRAWINGS

FIG. 1D shows field crossovers in the optical ray diagram for the configuration in FIG. 1A.

FIG. 2B is the corresponding optical ray diagram for the configuration in FIG. 2A.

FIG. 2D shows field crossovers in the optical ray diagram for the configuration in FIG. 2A.

FIG. 3 is a schematic diagram of a maskless reflection electron-beam projection lithography apparatus using an ExB separator in accordance with a third embodiment of the invention.

FIG. 4 is a schematic diagram of a maskless reflection electron-beam projection lithography apparatus using an ExB separator in accordance with a fourth embodiment of the invention.

FIG. 5 is a schematic diagram of a maskless reflection electron-beam projection lithography apparatus using an ExB separator in accordance with a fifth embodiment of the invention.

FIG. 6 is a schematic diagram of a maskless reflection electron-beam projection lithography apparatus using an ExB separator in accordance with a sixth embodiment of the invention.

FIGS. 7A and 7B are diagrams illustrating the operation of a dynamic pattern generator (DPG) in accordance with an embodiment of the invention.

SUMMARY

One embodiment of the invention relates to an apparatus for reflection electron beam lithography. The apparatus includes an electron source, a patterned electron reflector structure, a stage, a demagnifying electron lens system, and an ExB separator. The ExB separator configured to deflect a trajectory of the electron beam from the electron source structure towards the patterned electron reflector structure. The dynamic pattern generator structure is configured to reflect select portions of the electron beam so as to form a patterned electron beam. The ExB separator is further configured to allow the patterned electron beam to pass through towards the demagnifying electron lens. The demagnifying electron lens is configured to demagnify the patterned electron beam and project the demagnified patterned electron beam onto the target substrate.

Another embodiment relates to a process for electron beam lithography. An electron beam is formed from electrons emitted from an electron source. The trajectory of the electron beam is deflected towards a patterned electron reflector by an ExB separator. The select portions of the electron beam are reflected by the patterned electron reflector so as to form a patterned electron beam. The patterned electron beam is passed through the ExB separator substantially undeflected. The patterned electron beam is then demagnified and projected onto a target substrate.

Other embodiments and aspects are also disclosed.

DETAILED DESCRIPTION

Figure 1A:
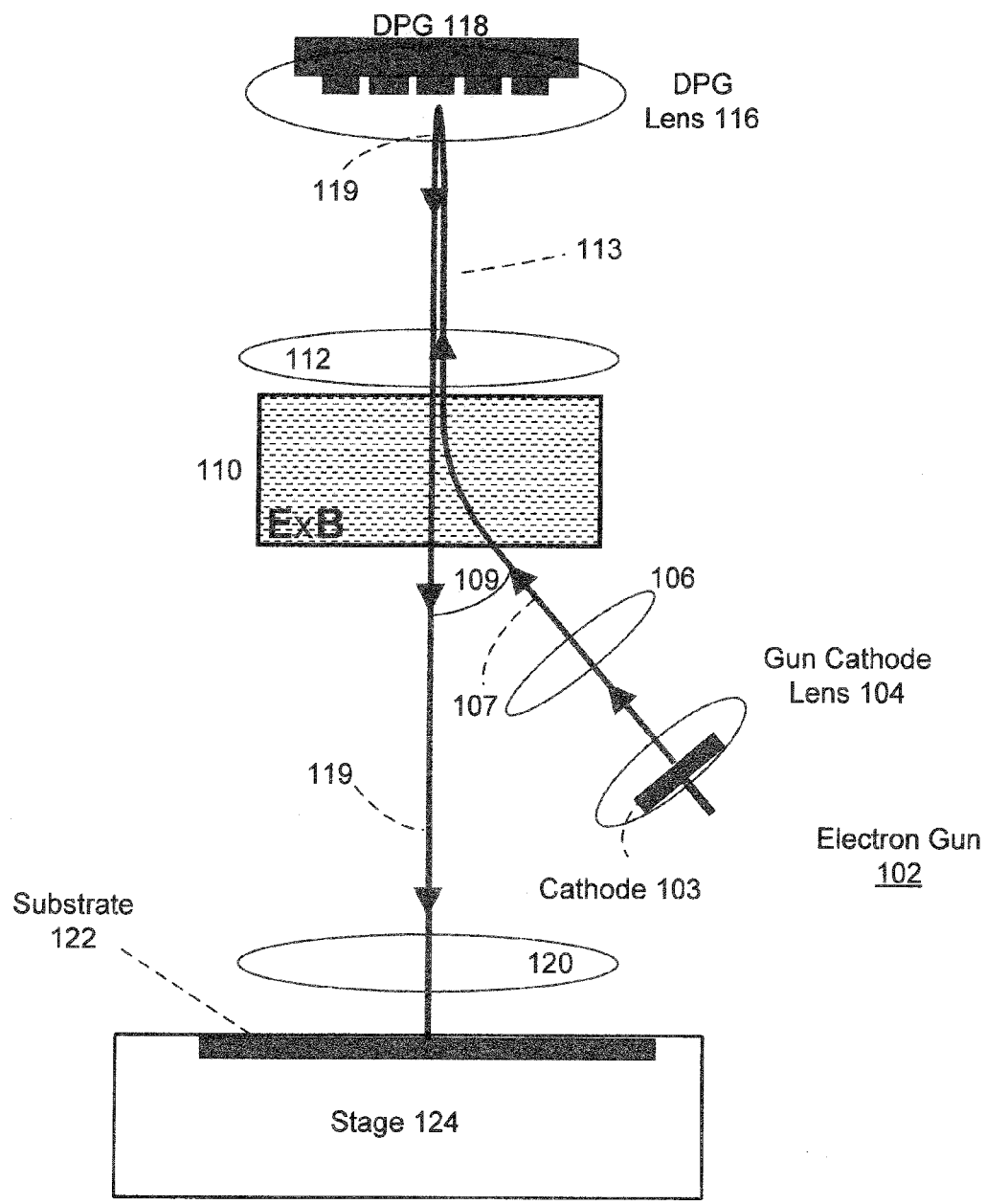
FIG. 1A is a schematic diagram of a maskless reflection electron-beam projection lithography apparatus using an ExB separator in accordance with a first embodiment of the invention.
Figure 1B:
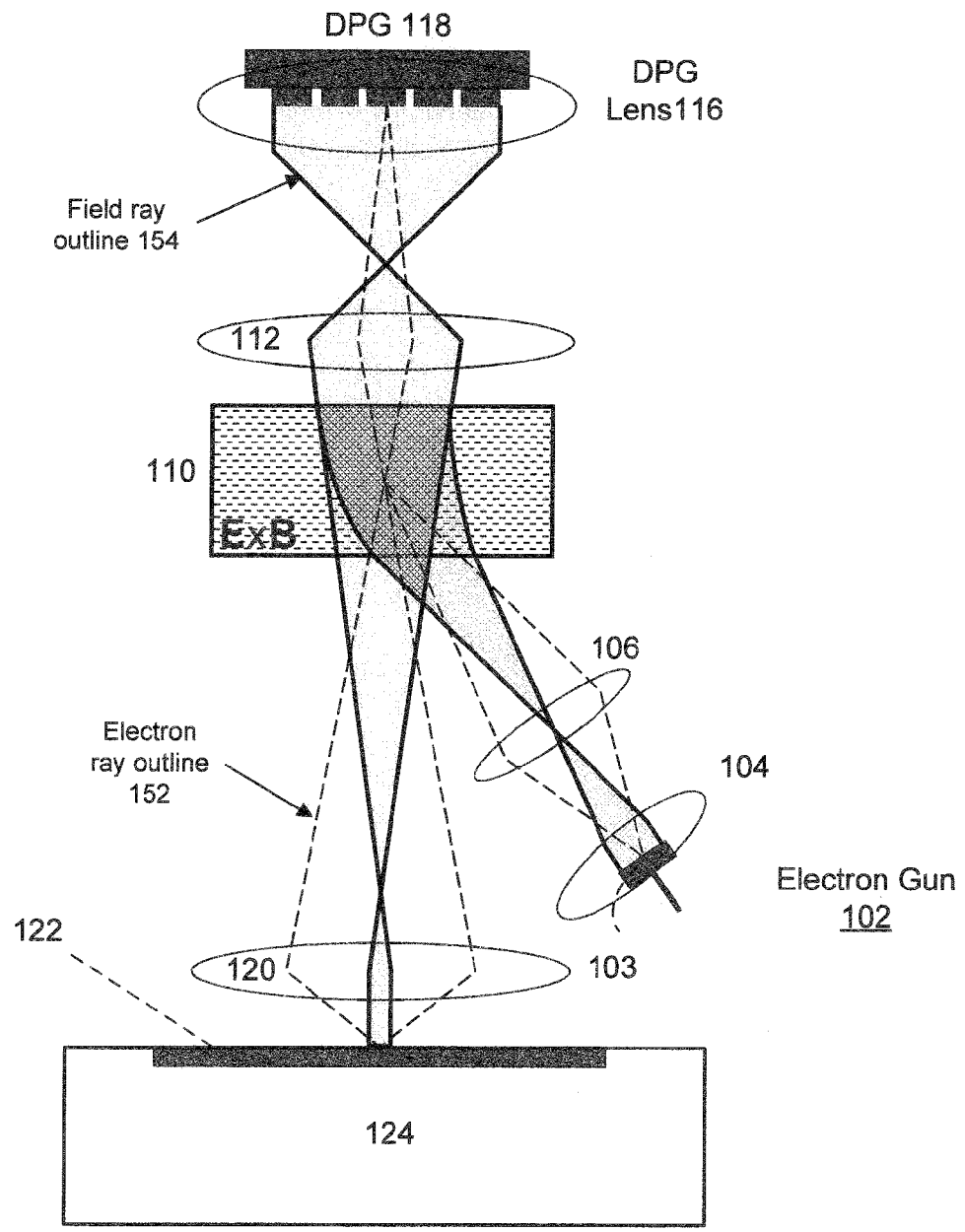
FIG. 1B is the corresponding optical ray diagram for the configuration in FIG. 1A.
Figure 1C:
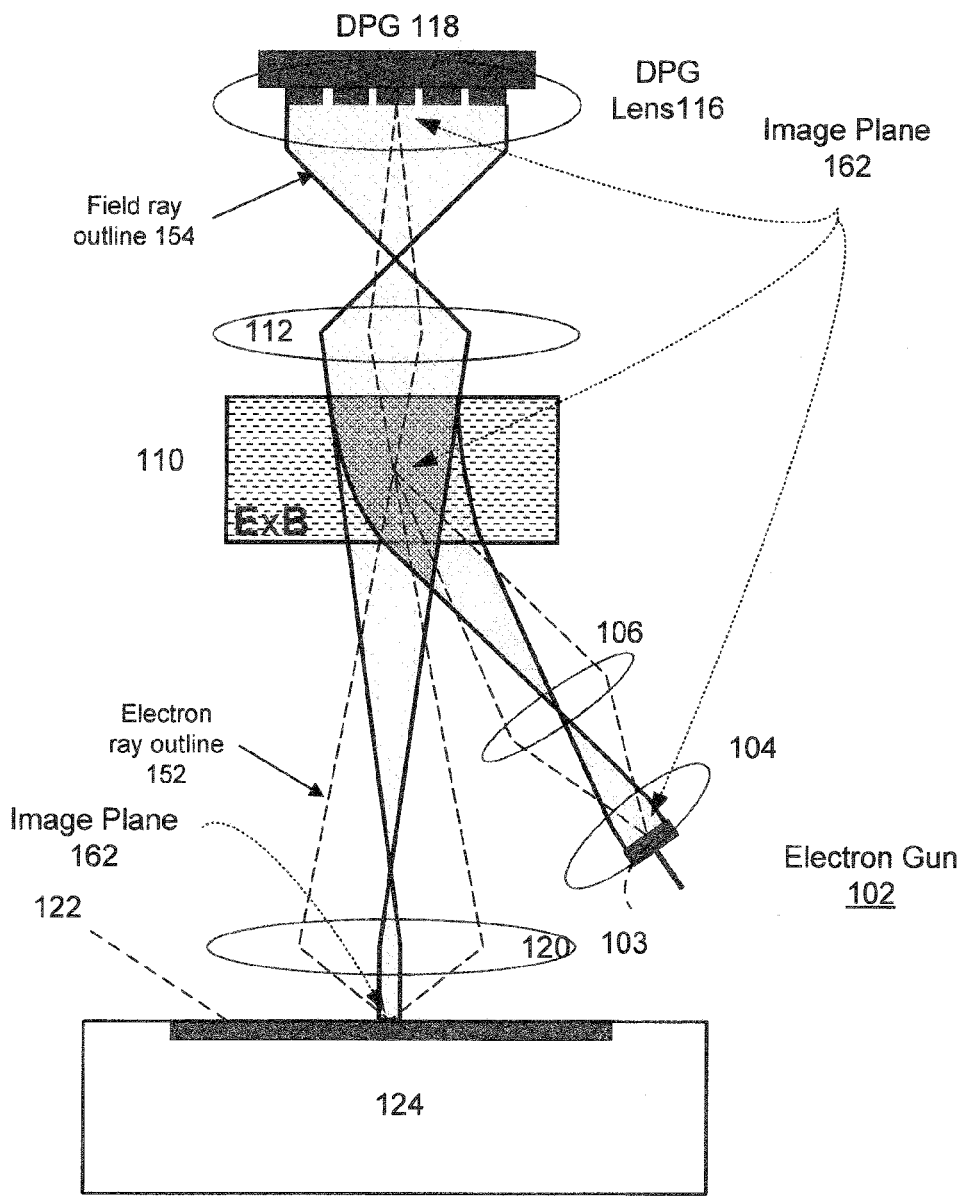
FIG. 1C shows image planes in the optical ray diagram for the configuration in FIG. 1A.

FIG. 1A is a schematic diagram of a maskless reflection electron-beam projection lithography apparatus 100 using an ExB separator 110 in accordance with a first embodiment of the invention. FIGS. 1B, 1C and 1D are corresponding electron-optical ray diagrams for the configuration in FIG. 1A. The apparatus 100 includes an electron gun (source) 102 including a cathode 103 and a gun cathode lens 104 to form an electron beam.

The gun cathode lens 104 may be an immersion cathode lens which focuses electrons emitted from the cathode 103 into a crossover near the first field lens 106. This first field lens 106 images the cathode into the vicinity of the ExB separator 110. In one implementation, the cathode lens 104 forms a beam crossover within or near the first field lens 106. The ExB separator 110 is arranged just below a first demagnification (demag) lens 112 and is arranged to bend or deflect the trajectory of the electron beam 107 towards the DPG 118. This deflection occurs because the velocity of the electrons comprising the electron beam is predominantly in such a direction so that the electric force and magnetic force of the ExB separator (which are of equal value) add, doubling the deflection force. The angle of deflection 109 is relatively small, for example, in a range of 10 to 20 degrees. (The angle of deflection 109 by the separator 110 is also the angle of incidence 109 of the electron beam 107 into the separator 110.) The ExB separator 110 is described further below in relation to FIGS. 8A and 8B.

The first demag lens 112 focuses the re-directed electron beam 113 so as to form another crossover above the first demag lens 112 and simultaneously forms a magnified image of the cathode 103 located in the vicinity of the ExB separator 110 onto the DPG 118. The magnified image of the cathode may be made intentionally slightly out of focus in order to obtain increased illumination uniformity at the DPG 118. The DPG lens 116 may be an electrostatic lens which serves a dual purpose. In particular, the DPG lens 116 may form a virtual image of the crossover at infinity and decelerates the electrons of the re-directed electron beam 113 to within a few volts of the cathode potential. The DPG lens 116 may comprise, for example, an immersion cathode lens which is configured to deliver an effectively uniform current density (i.e. a relatively homogeneous flood beam) over a large area in a plane at the surface of the DPG 118.

In one embodiment, the DPG 118 comprises a two-dimensional array of pixels. Each pixel may comprise an electrically conductive contact to which a voltage level is controllably applied. The operation of the DPG 118 is described below in relation to FIGS. 7A and 7B. Alternatively, the dynamic pattern generator may be replaced by another patterned electron reflector, such as, for example, a static patterned electron reflector in which the pattern is not dynamically configurable.

As the reflected electrons 119 leave the DPG 118, the DPG lens 116 is configured to re-accelerate the reflected electrons 119 toward their second pass through the first demag lens 112 and the ExB separator 110 and focuses the beam to form a crossover above the first demag 112 at the same location as for the beam from the cathode 103. The ExB separator 110 is configured to receive the reflected electrons 119 from the first demag lens 112 and to pass (without deflection) the reflected electrons towards the second demag lens 120. In this case the electrons comprising the electron beam past without deflection because their velocity is predominantly in such a direction so that the electric force and magnetic force of the ExB separator cancel. The first demag lens 112 simultaneously forms a demagnified image of the DPG 118 at the same location as for the image of the cathode in the vicinity of the ExB separator 110 and focuses the undeflected electron beam 113 so as to form another crossover in the vicinity just above the final demag lens 120. As seen, the projection axis (vertical in FIG. 1) going from the DPG 118 to the stage 124 is straight. This is advantageous compared with a bent projection axis in a prior apparatus using a magnetic prism separator.

The final demag lens 120 is positioned between the ExB separator 110 and the target substrate 122. The final demag lens 120 is configured to focus the reflected electron beam 119 and demagnify the beam onto the target substrate 122. The target substrate 122 may be, for example, a semiconductor wafer with a photoresist layer on its surface The blur and distortion due to the final demag lens 120 is preferably a fraction of the pixel size.

The substrate stage 124 holds the target substrate 122. In one embodiment, the stage 124 is stationary during the lithographic projection. In another embodiment, the stage 124 is in motion during the lithographic projection. In the case where the stage 124 is moving, during the lithographic projection, the pattern on the DPG 118 may be dynamically adjusted to compensate for the motion such that the projected pattern moves in correspondence with the wafer movement. The stage 124 may be configured for linear motion or rotary motion.

FIG. 1B depicts an outline of optical ray traces 152 (dashed lines) and an outline of field ray traces 154 (solid lines). The field ray traces 154 correspond approximately to the shape of the electron beam, while the optical (or image) ray traces 152 are provided to show the image plane positions. Image planes 162 are shown in FIG. 1C at crossover points in the optical ray traces 152. Field crossovers 164 are shown in FIG. 1D at crossover points in the field ray traces 154.

Figure 2A:
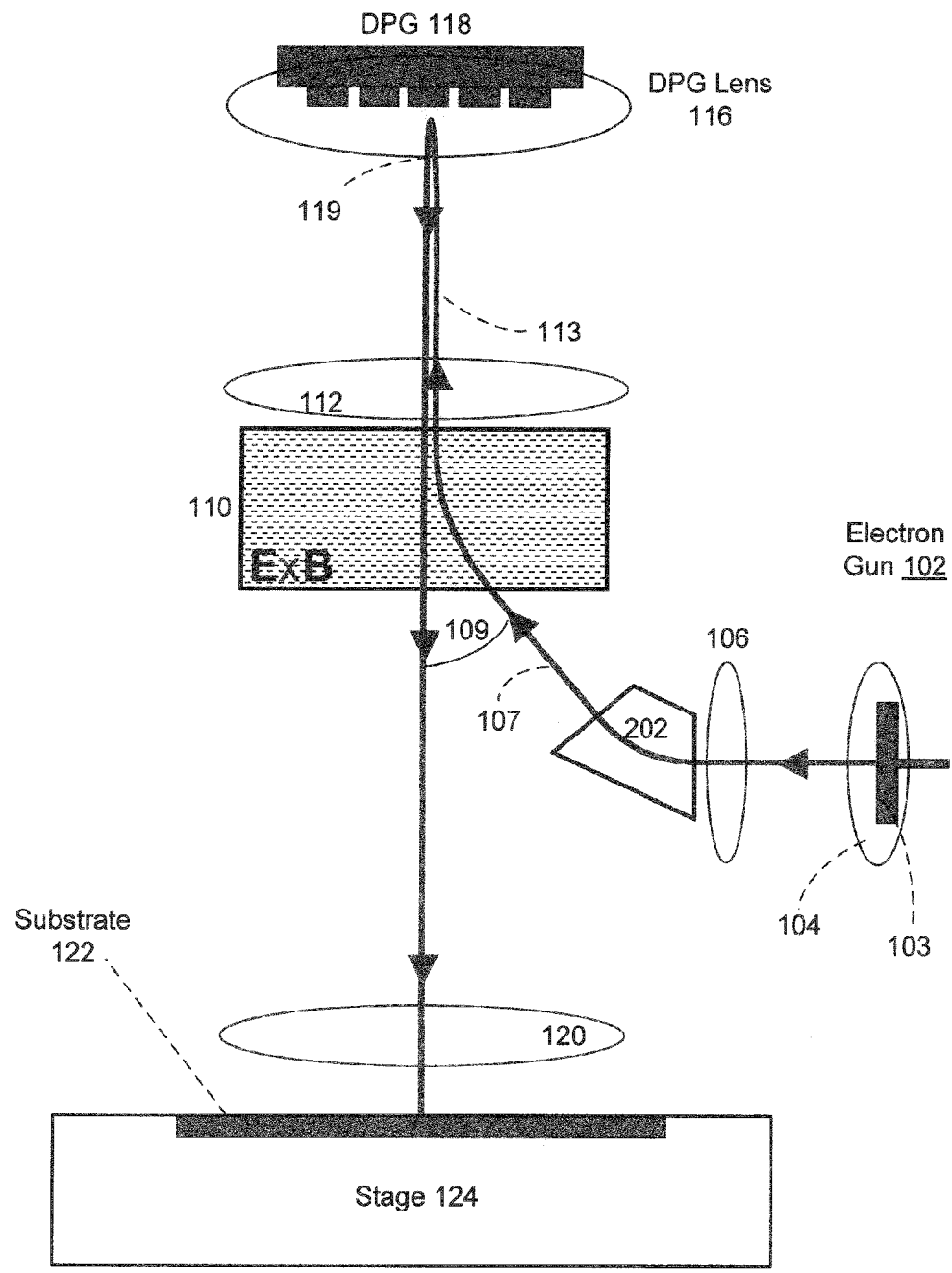
FIG. 2A is a schematic diagram of a maskless reflection electron-beam projection lithography apparatus using an ExB separator in accordance with a second embodiment of the invention.
Figure 2C:
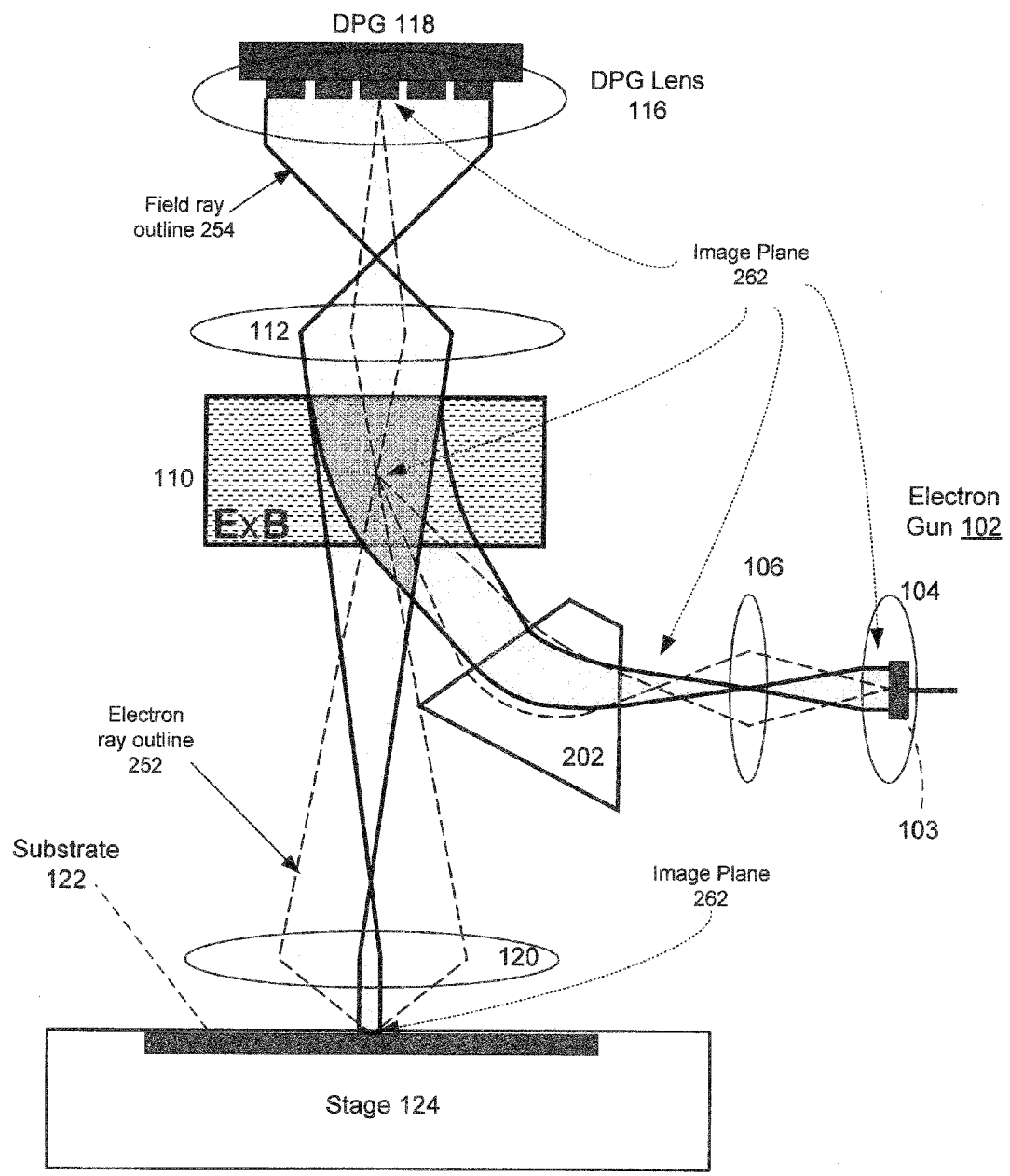
FIG. 2C shows image planes in the optical ray diagram for the configuration in FIG. 2A.

FIG. 2A is a schematic diagram of a maskless reflection electron-beam projection lithography apparatus 200 using an ExB separator 110 in accordance with a second embodiment of the invention. FIGS. 2B, 2C and 2D are corresponding optical and field ray diagrams for the configuration in FIG. 2A.

The apparatus 200 in FIG. 2A differs from the apparatus 100 of FIG. 1A in that a bending element 202 is inserted between the first field lens 106 and the ExB separator 110. In addition, the positions of the electron gun 102 and first field lens 106 are adjusted such that the electron beam travels through, and is bent by, the bending element 202 on its way to the ExB separator 110. The bending element advantageously allows for the electron gun 102 and the first field lens 106 to be arranged further away from the projection axis while still providing a relatively shallow angle of incidence 109 of the electron beam into the ExB separator 110. The bending element 202 may comprise an electrostatic or magnetic prism, for example. They may also act in such a way as to provide a weak lensing optical element.

FIG. 2B depicts an outline of optical ray traces 252 (dashed lines) and an outline of field ray traces 254 (solid lines). The field ray traces 254 correspond approximately to the shape of the electron beam, while the optical (or image) ray traces 252 are provided to show the image plane positions. Image planes 262 are shown in FIG. 2C at crossover points in the optical ray traces 252. Field crossovers 264 are shown in FIG. 2D at crossover points in the field ray traces 254.

FIG. 3 is a schematic diagram of a maskless reflection electron-beam projection lithography apparatus 700 using an ExB separator 110 in accordance with a third embodiment of the invention. In this embodiment, a first demagnifier lens 304 and a transfer lens 306 are arranged between the ExB separator 110 and the final demag lens 120.

FIG. 4 is a schematic diagram of a maskless reflection electron-beam projection lithography apparatus 400 using an ExB separator 110 in accordance with a fourth embodiment of the invention. The apparatus 400 in FIG. 4 differs from the apparatus 100 of FIG. 1A in that the positions of the electron gun 102 and the first field lens 106 are adjusted to such that the electron beam is reflected by an electron mirror 404 prior to having its trajectory bent by the ExB separator 110. The use of the electron mirror 404 advantageously allows for the electron gun 102 and first field lens 106 to be arranged further away from the projection axis while still providing a relatively shallow angle of incidence 109 of the electron beam into the ExB separator 110. The electron mirror 404 may comprise, for example, an electrostatic-based device. Another difference is that the apparatus 400 of FIG. 4 has a field lens 402 which is arranged to apply a field within the ExB separator 110 and a transfer lens 406 positioned between the ExB separator 110 and the DPG 118.

FIG. 5 is a schematic diagram of a maskless reflection electron-beam projection lithography apparatus 500 using an ExB separator 110 in accordance with a fifth embodiment of the invention. The apparatus 500 in FIG. 5 differs from the apparatus 400 of FIG. 4 in that the positioning of the electron gun 102, gun cathode lens 104, first field lens 106, and the electron mirror 404 are changed. Similar to FIG. 4, the electron beam is reflected by an electron mirror 404 prior to having its trajectory bent by the ExB separator 110.

FIG. 6 is a schematic diagram of a maskless reflection electron-beam projection lithography apparatus 600 using an ExB separator 110 in accordance with a sixth embodiment of the invention. In this embodiment, after passing through the ExB separator 110, the electron beam passes through a second ExB separator 602. The second ExB separator 602 is configured in an opposite manner as the first ExB separator 110 so as to cancel chromatic aberrations in the beam that were introduced by the first ExB separator 110. For example, the second ExB separator 602 may have both its magnetic poles (north and south) reversed and its electric poles (positive and negative) reversed in comparison to the first ExB separator 110. The resultant electron beam is provided to the final demagnification lens 120 for projection onto the surface of the substrate 122. This application of aberration canceling ExB separators may also be applied in most of the other configurations.

FIGS. 7A and 7B are diagrams illustrating the operation of a dynamic pattern generator (DPG) in accordance with an embodiment of the invention. FIG. 7A shows a cross-section of a DPG substrate 702 showing a column (or row) of pixels. Each pixel includes a conductive area 704. A controlled voltage level is applied to each pixel. In the example illustrated in FIG. 7A, four of the pixels are "off" and have zero (0) volts applied thereto, while one pixel (with conductive area labeled 704a) is "on" and has one (1) volt applied thereto. (The specific voltages may vary depending on the parameters of the system.) The resultant local electrostatic equipotential lines 706 are shown, with distortions 706a relating to "off" pixel shown. In this example, the incident electrons 708 approaching the DPG come to a halt in front of and are reflected by each of the "on" pixels, but the incident electrons 708a are drawn into and absorbed by the "off" pixel. The resultant reflected current (in arbitrary units) is shown in FIG. 7B. As seen from FIG. 7B, the reflected current is "0" for the "off" pixel and "1" for the "on" pixels.

Figure 8A:
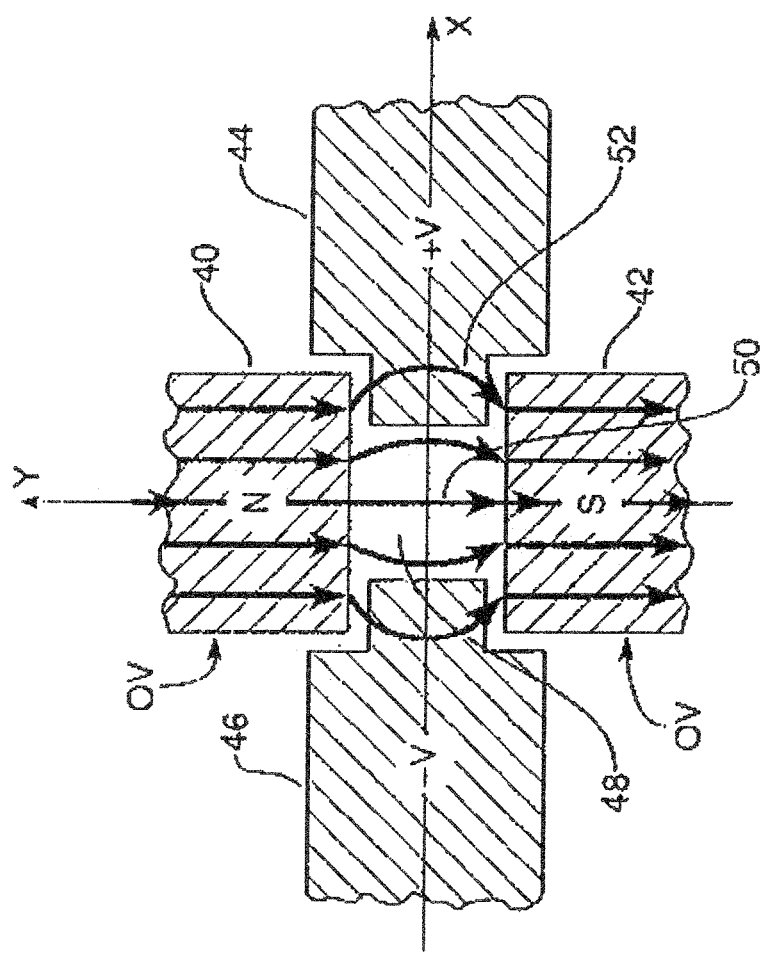
FIGS. 8A and 8B are cross-sectional diagrams depicting an ExB separator in accordance with an embodiment of the invention.
Figure 8B:
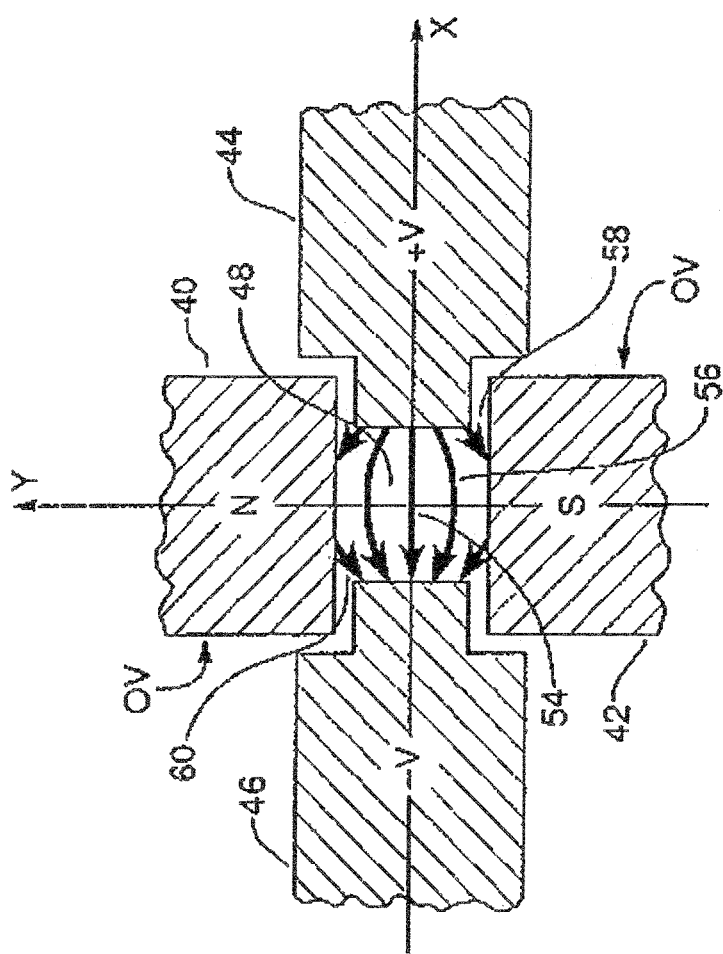

An ExB separator may also be called a Wien filter. FIGS. 8A and 8B are cross-sectional diagrams of an example ExB separator. Depicted in FIGS. 8A and 8B are magnetic field pole pieces (North) 40 and (South) 42 and electric field pole pieces (positive) 44 and (negative) 46. Illustrative magnetic field lines (50 and 52) are shown in FIG. 8A as they extend through the magnetic material of pole pieces 40 and 42 and between them in the space 48, through which beam 14 passes. Meanwhile, FIG. 8B shows illustrative electric field lines (54, 56, 58, and 60) which result when voltages +V and −V are applied to electric pole pieces 44 and 46, respectively. The ExB separator or Wien filter example described is manifest in its simplest form, that of a dipole electric and magnetic field. In order to decrease aberrations, higher order multipole electric and magnetic deflectors may be employed, typically octapole or even higher would be ideal. Generally, for the higher order multipoles, the same pole piece would be used to define both the electric and magnetic fields.

First, consider an electron beam with a trajectory coming out of the plane of the page along the Z-axis, i.e. traveling in the +Z direction. The magnetic field will apply a force to the beam in the −X direction (going to the left in FIG. 8A). The electric field will apply a force to the beam in the +X direction (going to the right in FIG. 8B). The field strengths are adjusted so that the magnetic and electric forces cancel in this case. As such, the electron beam passes through the ExB separator with its trajectory substantially unchanged.

Second, consider an electron beam with a trajectory going into the plane of the page along the Z-axis, i.e. traveling in the −Z direction. The magnetic field will apply a force to the beam in the +X direction (going to the right in FIG. 8A). The electric field will also apply a force to the beam in the +X direction (going to the right in FIG. 8B). As such, the electron beam is deflected to the right as it passes through the ExB separator with the equivalent of double the force of either the electric or magnetic forces.

The apparatus for reflective electron beam lithography disclosed herein is surprisingly advantageous. In particular, the apparatus has a straight projection axis and substantially reduces the electron beam path by a factor of three-to-one (compared to a prior apparatus which uses a magnetic prism). This reduction in electron beam path length substantially reduces the coulomb blur caused by electron-electron interaction. The reduced coulomb blur allows substantially greater current to be utilized in the beam (with the same blur), and the substantially greater current enables higher throughput for the lithography system. A further advantage is that the setup and alignment of the apparatus is simplified due to the axial symmetric projection axis.

The above-described diagrams are not necessarily to scale and are intended be illustrative and not limiting to a particular implementation. In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. An apparatus for reflection electron beam lithography, the apparatus comprising:
   an electron source structure arranged to form an electron beam from emitted electrons;
   a patterned electron reflector structure which is configured to reflect select portions of the electron beam so as to form a patterned electron beam;
   a stage to hold a target substrate;
   a demagnifying electron lens which is configured to demagnify the patterned electron beam and project the demagnified patterned electron beam onto the target substrate;
   an ExB separator configured to deflect a trajectory of the electron beam from the electron source structure towards the patterned electron reflector structure and to allow the patterned electron beam to pass straight through towards the demagnifying electron lens; and a field lens comprising an electron lens which is configured to act on the electron beam and the patterned electron beam as the electron beam and the patterned electron beam pass through the ExB separator.

2. The apparatus of claim 1, wherein the electron source structure comprises an electron gun and a gun cathode lens.

3. The apparatus of claim 1, wherein the patterned electron reflector structure comprises a dynamic pattern generator and an immersion cathode lens.

4. The apparatus of claim 1, further comprising:
a field lens comprising an electron lens which is configured to act on the electron beam between the ExB separator and the patterned electron reflector.

5. The apparatus of claim 1, further comprising:
an electron mirror positioned to reflect the electron beam prior to the electron beam reaching the ExB separator.

6. The apparatus of claim 1, further comprising:
a bending element positioned in between the electron source structure and the ExB separator and configured to bend a trajectory of the electron beam prior to the electron beam reaching the ExB separator.

7. An apparatus for reflection electron beam lithography, the apparatus comprising:
an electron source structure arranged to form an electron beam from emitted electrons;
a patterned electron reflector structure which is configured to reflect select portions of the electron beam so as to form a patterned electron beam;
a stage to hold a target substrate;
a demagnifying electron lens which is configured to demagnify the patterned electron beam and project the demagnified patterned electron beam onto the target substrate;
an ExB separator configured to deflect a trajectory of the electron beam from the electron source structure towards the patterned electron reflector structure and to allow the patterned electron beam to pass straight through towards the demagnifying electron lens;
an electron mirror positioned to reflect the electron beam prior to the electron beam reaching the ExB separator; and
a field lens comprising an electron lens which is configured to act on the electron beam and the patterned electron beam as the electron beam and the patterned electron beam pass through the ExB separator.

8. The apparatus of claim 7, wherein the electron source structure and the electron mirror are positioned on opposite sides of the ExB separator.

9. A process for electron beam lithography, the process comprising:
forming an electron beam from electrons emitted from an electron source;
bending a trajectory of the electron beam prior to the electron beam reaching an ExB separator;
bending a trajectory of the electron beam towards a patterned electron reflector by the ExB separator, wherein a field lens acts on the electron beam as the electron beam passes through the ExB separator;
reflecting select portions of the electron beam by the patterned electron reflector so as to form a patterned electron beam;
passing the patterned electron beam through the ExB separator, wherein the field lens acts on the patterned electron beam as the patterned electron beam passes through the ExB separator;
demagnifying the patterned electron beam; and
projecting the demagnified patterned electron beam onto a target substrate.

10. The process of claim 9, further comprising:
reflecting the electron beam by an electron mirror prior to the electron beam reaching the ExB separator.

11. The process of claim 9, wherein the ExB separator is a first ExB separator, further comprising:
passing the patterned electron beam through a second ExB separator prior to demagnifying the patterned electron beam.

12. The process of claim 11, wherein the second ExB separator is arranged with positions of magnetic poles reversed and positions of electric poles reversed in comparison to the first ExB separator.

* * * * *